United States Patent
Wang et al.

(10) Patent No.: US 11,411,383 B2
(45) Date of Patent: Aug. 9, 2022

(54) LEAKAGE PROTECTION CIRCUIT, LEAKAGE PROTECTION METHOD AND LOAD DRIVING CIRCUIT

(71) Applicant: Silergy Semiconductor Technology (Hangzhou) LTD, Hangzhou (CN)

(72) Inventors: Longqi Wang, Hangzhou (CN); Jianxin Wang, Hangzhou (CN)

(73) Assignee: Silergy Semiconductor Technology (Hangzhou) LTD, Hangzhou (CN)

( * ) Notice: Subject to any disclaimer, the term of this patent is extended or adjusted under 35 U.S.C. 154(b) by 220 days.

(21) Appl. No.: 16/920,860

(22) Filed: Jul. 6, 2020

(65) Prior Publication Data
US 2021/0028616 A1   Jan. 28, 2021

(30) Foreign Application Priority Data
Jul. 23, 2019 (CN) .......................... 201910665631.8

(51) Int. Cl.
*H02H 3/16* (2006.01)
*G01R 31/52* (2020.01)
*H02H 1/00* (2006.01)
*H02M 7/06* (2006.01)
*H02M 1/32* (2007.01)
*H02M 1/00* (2006.01)

(52) U.S. Cl.
CPC ............... *H02H 3/16* (2013.01); *G01R 31/52* (2020.01); *H02H 1/0007* (2013.01); *H02M 1/007* (2021.05); *H02M 1/32* (2013.01); *H02M 7/06* (2013.01)

(58) Field of Classification Search
CPC ........ G01R 31/52; H02H 1/0007; H02H 3/16; H02M 1/007; H02M 1/32; H02M 7/06
See application file for complete search history.

(56) References Cited

U.S. PATENT DOCUMENTS

| | | |
|---|---|---|
| 6,075,716 A | 6/2000 | He et al. |
| 6,385,057 B1 | 5/2002 | Barron |
| 8,471,488 B1 | 6/2013 | Hopkins et al. |
| 9,077,260 B2 | 7/2015 | Zhao et al. |
| 9,124,169 B2 | 9/2015 | Garlow et al. |
| 9,525,336 B2 | 12/2016 | Huang |
| 11,002,441 B2 * | 5/2021 | Sun ........................ F21K 9/272 |
| 2009/0243398 A1 | 10/2009 | Yohanan et al. |
| 2015/0207398 A1 | 7/2015 | Proca |
| 2015/0216007 A1 | 7/2015 | Ferrara et al. |
| 2016/0190794 A1 * | 6/2016 | Forghani-Zadeh .... H02H 9/045 361/86 |
| 2018/0241195 A1 * | 8/2018 | Zhang ................... H05B 47/20 |

FOREIGN PATENT DOCUMENTS

CN   108093534 A   5/2008

* cited by examiner

*Primary Examiner* — Terrell S Johnson (57) ABSTRACT

A leakage protection circuit can include: a pull-down current generation circuit coupled between output terminals of a rectifier circuit; and a control circuit configured to control the pull-down current generation circuit to generate a pull-down current during a predetermined time interval, and to determine whether leakage occurs in accordance with a voltage detection signal that is representative of an output voltage of the rectifier circuit.

20 Claims, 8 Drawing Sheets

LEAKAGE PROTECTION CIRCUIT, LEAKAGE PROTECTION METHOD AND LOAD DRIVING CIRCUIT

RELATED APPLICATIONS

This application claims the benefit of Chinese Patent Application No. 201910665631.8, filed on Jul. 23, 2019, which is incorporated herein by reference in its entirety.

FIELD OF THE INVENTION

The present invention generally relates to the field of power electronics, and more particularly to leakage protection circuits, leakage protection methods, and load driving circuitry.

BACKGROUND

A switched-mode power supply (SMPS), or a "switching" power supply, can include a power stage circuit and a control circuit. When there is an input voltage, the control circuit can consider internal parameters and external load changes, and may regulate the on/off times of the switch system in the power stage circuit. Switching power supplies have a wide variety of applications in modern electronics. For example, switching power supplies can be used to drive light-emitting diode (LED) loads.

DETAILED DESCRIPTION

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

During the assembly operation of loads (e.g., light-emitting diodes [LEDs]), electric leakage caused by man-made operations can occur, and users may mistouch conductive parts, thereby giving rise to the danger of electric shock. For example, in the field of lighting, two end caps of a lamp can respectively connect with a lamp socket of an AC input power. In the assembly process, when users insert one end cap of the lamp into the lamp socket, they may mistouch conductive parts of the other end cap of the lamp, which may not be inserted into the lamp socket, thereby giving rise to the danger of electric shock. Accordingly, a method for leakage protection is important.

Figure 1:
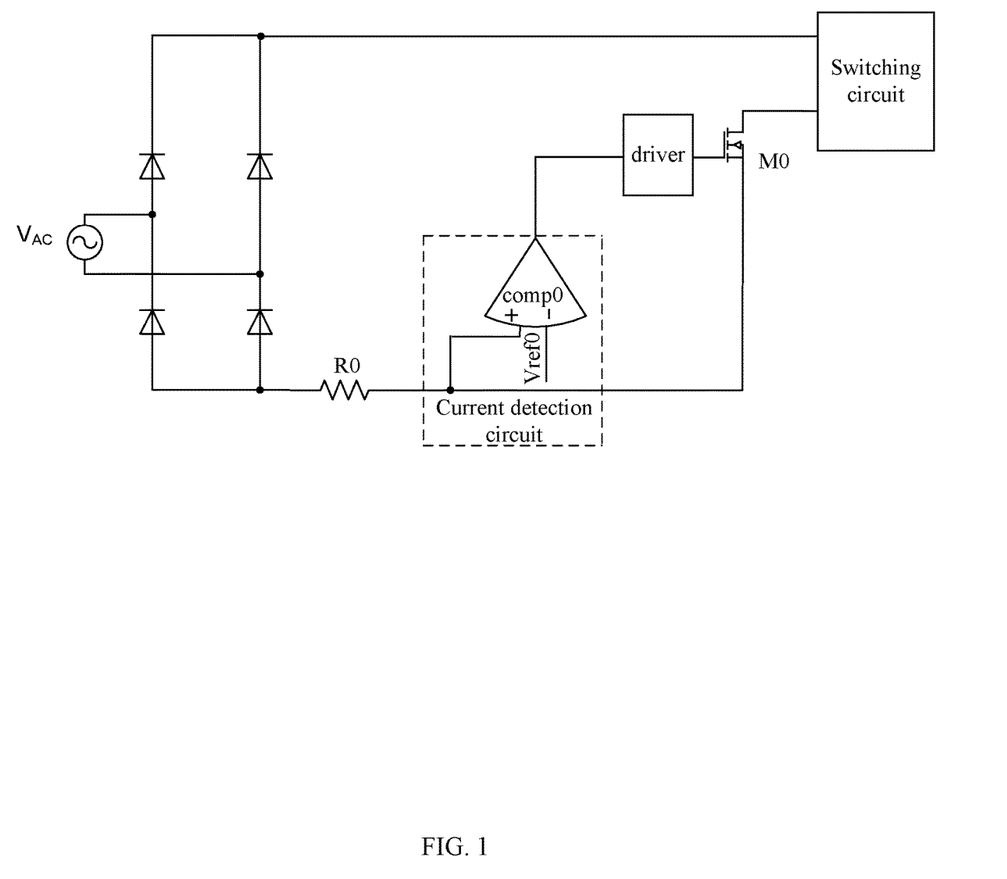
FIG. 1 is a schematic block diagram of one example leakage protection circuit.

Referring now to FIG. 1, shown is a schematic block diagram of an example leakage protection circuit. Here, a switch transistor can connect to a main circuit. When the main circuit operates, the switch transistor can be turned on and a current flowing through the switch transistor can be detected. Whether a leakage phenomenon occurs can be determined by the magnitude of the current flowing through the switch transistor. If no leakage phenomenon occurs, the entire circuit can begin to operate. In this particular example, switch transistor M0 can connect between a rectifier circuit and a switching circuit, and may be turned on for a period of time during each cycle. During this period of time, a current detection circuit can detect a current flowing through switch transistor M0, and may compare the current against threshold value Vref0. When the current is less than threshold value Vref0, a leakage phenomenon may occur at the input terminal of the rectifier circuit, such that switch transistor M0 can be turned off in order to cut off the main circuit, thereby performing leakage protection. When the current is greater than threshold value Vref0, switch transistor M0 may remain on. However, since switch transistor M0 can connect in the main circuit, the current flowing through switch transistor M0 may be relatively large, such that the energy loss is relatively large, and the associated requirements for switch transistor M0 are relatively high. In addition, if there is a relatively large inductance at the input terminal of the rectifier circuit, the leakage detection may fail in this approach.

In one embodiment, a leakage protection circuit can include: (i) a pull-down current generation circuit coupled between output terminals of a rectifier circuit; and (ii) a control circuit configured to control the pull-down current generation circuit to generate a pull-down current during a predetermined time interval, and to determine whether leakage occurs in accordance with a voltage detection signal that is representative of an output voltage of the rectifier circuit. In one embodiment, a method of performing leakage protection for input terminals of a load driving circuit, can include: (i) generating a pull-down current during a predetermined time interval; and (ii) determining whether leakage occurs in accordance with a voltage detection signal that is representative of an output voltage of a rectifier circuit.

Figure 2:
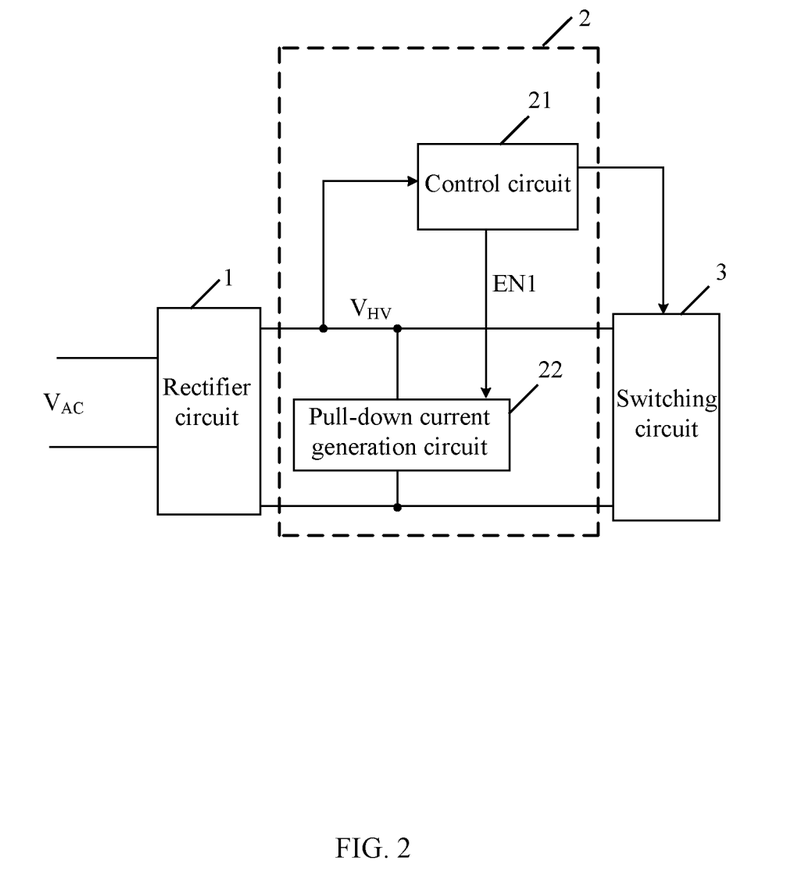
FIG. 2 is a schematic block diagram of a first example leakage protection circuit, in accordance with embodiments of the predetermined invention.

Referring now to FIG. 2, shown is a schematic block diagram of a first example leakage protection circuit, in accordance with embodiments of the predetermined invention. This particular example leakage protection circuit 2 can include control circuit 21 and pull-down current generation circuit 22. Pull-down current generation circuit 22 can connect between output terminals of rectifier circuit 1. Control circuit 21 can control pull-down current generation circuit 22 to generate a pull-down current during a predetermined time interval, and can determine whether leakage occurs in accordance with voltage detection signal $V_{HV}$ that is representative of an output voltage of rectifier circuit 1. In particular embodiments, leakage protection circuit 2 may be applied to perform leakage protection for alternating current input terminals of a load driving circuit, and rectifier circuit 1 can connect to the alternating current input terminals of the load driving circuit. The change rate of the voltage detection signal over time when leakage occurs can be greater than the change rate of the voltage detection signal over time when leakage does not occur.

In certain embodiments, there are many ways to detect the change rate of voltage detection signal $V_{HV}$. In one embodiment, whether leakage occurs can be determined by detecting the change rate of voltage detection signal $V_{HV}$ during a detection time interval which is included in the predetermined time interval. It should be understood that the change rate of voltage detection signal $V_{HV}$ over time may also be detected in other ways. In one embodiment, the predetermined time interval can be a time interval where voltage detection signal $V_{HV}$ is less than a first voltage threshold.

Further, if leakage occurs, no energy may be transferred to the load coupled to the output terminals of the rectifier circuit. If leakage does not occur, energy can be allowed to be transferred to the load coupled to the output terminals of rectifier circuit 1, and whether leakage occurs can be determined continually in a next cycle. It should be understood that although the above describes that voltage detection signal $V_{HV}$ may be generated by sampling the output voltage of rectifier circuit 1 directly, those skilled in the art will recognize that voltage detection signal $V_{HV}$ may be generated by sampling the divided output voltage of rectifier circuit 1, additionally or alternatively.

In one embodiment, when leakage protection circuit 2 detects no leakage after N times, energy can be allowed to be transferred to the load coupled to the output terminals of rectifier circuit 1. Otherwise, no energy may be transferred to the load coupled to the output terminals of rectifier circuit 1. For example, N is an integer that is greater than or equal to 1. Leakage protection circuit 2 can determine whether leakage occurs by performing multiple detections. If no leakage occurs after multiple detections, energy can be allowed to be transferred to the load coupled to the output terminals of rectifier circuit 1. The leakage protection circuit in this example may not be multiplexed with the main circuit, and the leakage protection circuit can be a separate loop circuit. This approach can achieve leakage protection without a relatively large switch transistor, in order to reduce cost and power consumption. Further, the leakage protection circuit can accurately detect whether leakage occurs when a large inductance is provided at the input terminals of the rectifier circuit, which may be feasible in various applications.

In one embodiment, the change rate of the voltage detection signal over time can be determined by comparing the voltage detection signal against a second voltage threshold during the detection time interval. When the voltage detection signal is consistently less than a second voltage threshold during the detection time interval, it may be determined that leakage occurs. When the voltage detection signal is not less than the second voltage threshold during the detection time interval, it can be determined that no leakage occurs. For example, the detection time interval can be included in the predetermined time interval, and the second voltage threshold may be less than the first voltage threshold.

For example, a start moment (i.e., point in time) of the predetermined time interval can be a moment when voltage detection signal $V_{HV}$ decreases to the first voltage threshold. In addition, the end moment of the predetermined time interval may be optional in different applications. In one embodiment, the end moment of the predetermined time interval may be a moment when the pull-down current decreases to a first current threshold. In one embodiment, the end moment of the predetermined time interval may be a moment when voltage detection signal $V_{HV}$ reaches a third voltage threshold for the second time, where the third voltage threshold is less than the second voltage threshold. In one embodiment, the end moment of the predetermined time interval may be a moment when the start moment of the predetermined time interval is delayed by a first time period.

In addition, an end moment of the detection time interval may be consistent with (e.g., the same as) the end moment of the predetermined time interval, and the start moment of the detection time interval may not be earlier than the start moment of the predetermined time interval. For example, the start moment of the detection time interval can be later than the start moment of the predetermined time interval. For example, the start moment of the detection time interval may be a moment that delays the start moment of the predetermined time interval by a second time period. For example, the second time period can be less than the first time period, and the second time period may be set according to actual applications. In particular embodiments, whether leakage occurs in the detection time interval can be determined, and the start moment of the detection time interval may be a moment that delays a start moment of generating the pull-down current by the second time period. After the pull-down current is poured into the output terminal of the rectifier circuit, it takes time for voltage detection signal $V_{HV}$ to fall to the second voltage threshold, and the start moment of the detection time interval may be a moment that delays the start moment of the predetermined time interval by the second time period, thereby improving the accuracy of detection.

As shown in FIG. 2, leakage protection circuit 2 can be applied in the load driving circuit, in order to achieve the leakage protection for alternating current input terminals of the load driving circuit. For example, the load driving circuit can drive an LED load. This example load driving circuit can include rectifier circuit 1, switching circuit 3, and leakage protection circuit 2. Rectifier circuit 1 can receive alternating current input voltage $V_{AC}$, and may generate an output voltage to provide to switching circuit 3. Switching circuit 3 can supply power to the LED. It should be understood that rectifier circuit 1 may be a full-bridge rectifier circuit, a half-bridge rectifier circuit, or any other suitable rectifier circuitry. Further, switching circuit may be a flyback converter circuit, a buck converter circuit, a boost converter circuit, a buck-boost converter circuit, or a converter circuit of any other suitable topology type.

In one embodiment, the load driving circuit can further include a filter circuit, and the filter circuit can filter the output voltage of rectifier circuit 1. Leakage protection circuit 2 can connect before or after the filter circuit. Leakage protection circuit 2 can determine whether leakage occurs according to the change state of the voltage detection signal that is representative of the output voltage of rectifier circuit 1. In one embodiment, when leakage protection circuit 2 detects no leakage for N times, energy can be allowed to be transferred to the LED coupled to the output terminals of rectifier circuit 1. Further, switching circuit 3 can operate in order to provide power to the LED. In another example, the load driving circuit can include a power switch in or as the switching circuit, and the power switch and the LED can connect in a conductive path. When leakage protection circuit 2 detects no leakage for N times, the power switch can be turned on, in order to provide power to the LED.

Figure 3:
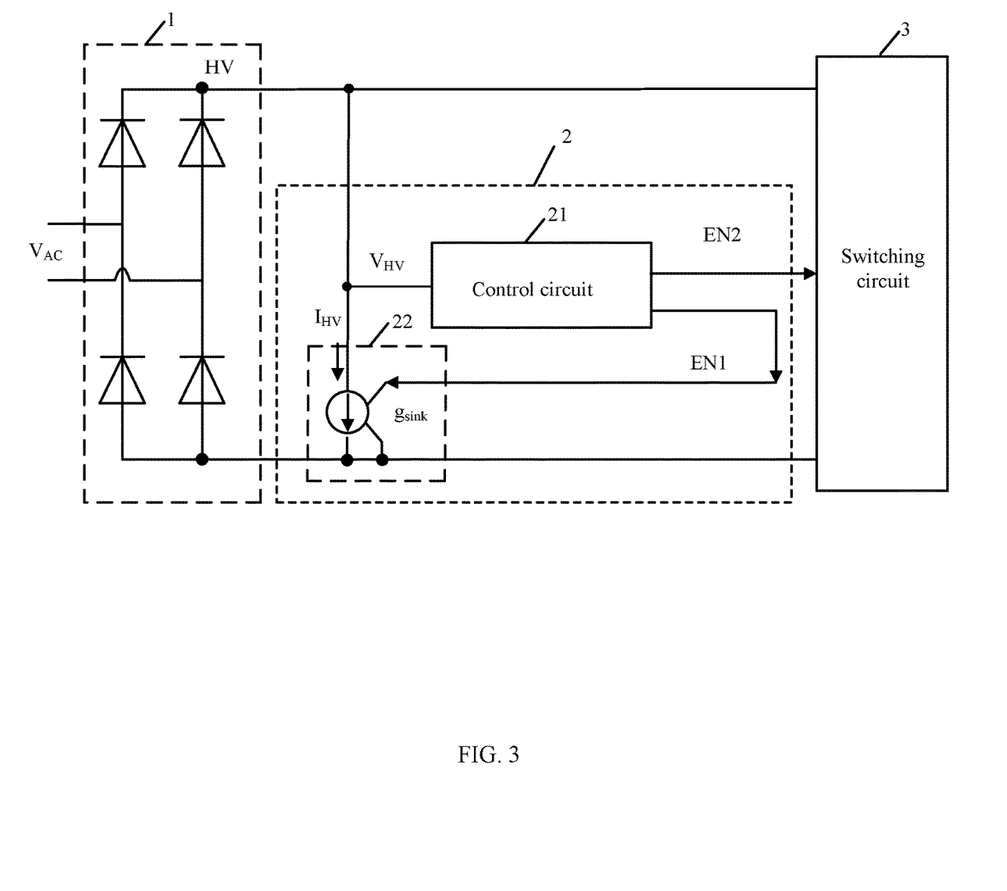
FIG. 3 is a schematic block diagram of a second example leakage protection circuit, in accordance with embodiments of the predetermined invention.

Referring now to FIG. 3, shown is a schematic block diagram of a second example leakage protection circuit, in accordance with embodiments of the predetermined invention. This example leakage protection circuit can include control circuit 21 and pull-down current generation circuit 22. Pull-down current generation circuit 22 can include transconductance operational amplifier gsink having an input terminal for receiving enable signal EN1, a first output terminal connecting to bus HV, and a second output terminal connecting to a ground reference. That is, transconductance operational amplifier gsink can connect between output terminals of rectifier circuit 1. An active interval of enable signal EN1 may be configured as a predetermined time interval. Control circuit 21 can control pull-down current generation circuit 22 to generate pull-down current $I_{HV}$ within the predetermined time interval, and may determine whether leakage occurs according to the change state of voltage detection signal $V_{HV}$ representative of an output voltage of rectifier circuit 1.

Control circuit 21 can receive voltage detection signal $V_{HV}$, and may generate enable signal EN1 according to voltage detection signal $V_{HV}$. When voltage detection signal $V_{HV}$ is less than a first voltage threshold, enable signal EN1 can be switched from an inactive state to an active state. That is, a start moment of the predetermined time interval may begin, and pull-down current generation circuit 22 can generate pull-down current $I_{HV}$ in accordance with enable signal EN1. Control circuit 21 can determine whether leakage occurs according to voltage detection signal $V_{HV}$ during a detection time interval. If voltage detection signal $V_{HV}$ is not greater than a second voltage threshold during the detection time interval, leakage can occur at input terminals of rectifier circuit 1, such that no energy may be transferred to the load coupled to the output terminals of rectifier circuit 1. For example, switching circuit 3 may not be enabled. If voltage detection signal $V_{HV}$ is greater than the second voltage threshold, no leakage can occur at input terminals of rectifier circuit 1, such that energy may be allowed to be transferred to the load coupled to the output terminal of rectifier circuit 1. For example, control circuit 21 can generate enable signal EN2, in order to enable switching circuit 3 to start operating (e.g., be enabled) and provide power to the load. For example, the detection time interval may be included in the predetermined time interval, and the second voltage threshold can be less than the first voltage threshold.

In this example, when leakage protection circuit 2 detects no leakage for only one time, switching circuit 3 can be enabled to operate in order to provide power the load. In another example, when leakage protection circuit 2 detects no leakage for N times, energy can be allowed to be transferred to the load coupled to the output terminals of rectifier circuit 1. Also, switching circuit 3 can be enabled to operate in order to provide power to the load. Otherwise, no energy may be transferred to the load coupled to the output terminals of rectifier circuit 1. For example, N is an integer that is greater than or equal to 1. In this way, when leakage occurs, the input voltage of rectifier circuit 1 as a power supply may be controlled in non-conductive state, thereby preventing a user from possible electric shock.

In one embodiment, the first input terminal of transconductance operational amplifier gsink can receive enable signal EN1, and the second input terminal of transconductance operational amplifier gsink can be grounded. In other embodiments, the first input terminal of transconductance operational amplifier gsink can receive enable signal EN1, and the second input terminal of transconductance operational amplifier can receive other voltage signal(s). Further, pull-down current generating circuit 22 can include a transistor. A control terminal of the transistor can receive enable signal EN1, and the first and second power terminals of the transistor can respectively be connected to the bus and the ground reference. That is, the transistor can connect between the output terminals of rectifier circuit 1. In this embodiment, the active interval of enable signal EN1 may be configured as the predetermined time interval. It should be understood that the transistor may be a metal-oxide-semiconductor (MOS) transistor, or a triode, and so on. Further, transconductance operational amplifier gsink may also include transistors.

For example, the start moment of the predetermined time interval can be a moment when the voltage detection signal falls to the first voltage threshold. The embodiments provides three ways to control the end moment of the predetermined time interval, respectively. In a first way, the end moment of the predetermined time interval may be a moment when the pull-down current falls to the first current threshold. In a second way, the end moment of the predetermined time interval may be a moment when the voltage detection signal reaches a third voltage threshold for the second time, and the third voltage threshold is less than the second voltage threshold. In a third way, the end moment of the predetermined time interval may be a moment time when the start moment of the predetermined time interval is delayed by a first time period.

In particular embodiments, the active interval of the first enable signal can be configured as the predetermined time interval. That is, the first enable signal can change from an inactive state to an active state at the start moment of the predetermined time interval, and the first enable signal can change from an active state to an inactive state at the end moment of the predetermined time interval. Further, the end moment of the detection time interval may be consistent with the end moment of the predetermined time interval, and the start moment of the detection time interval can be later than the start moment of the predetermined time interval. For example, the start moment of the detection time interval may be a moment that delays the start moment of the predetermined time interval by a second time period, and the second time period can be less than the first time period.

Figure 4:
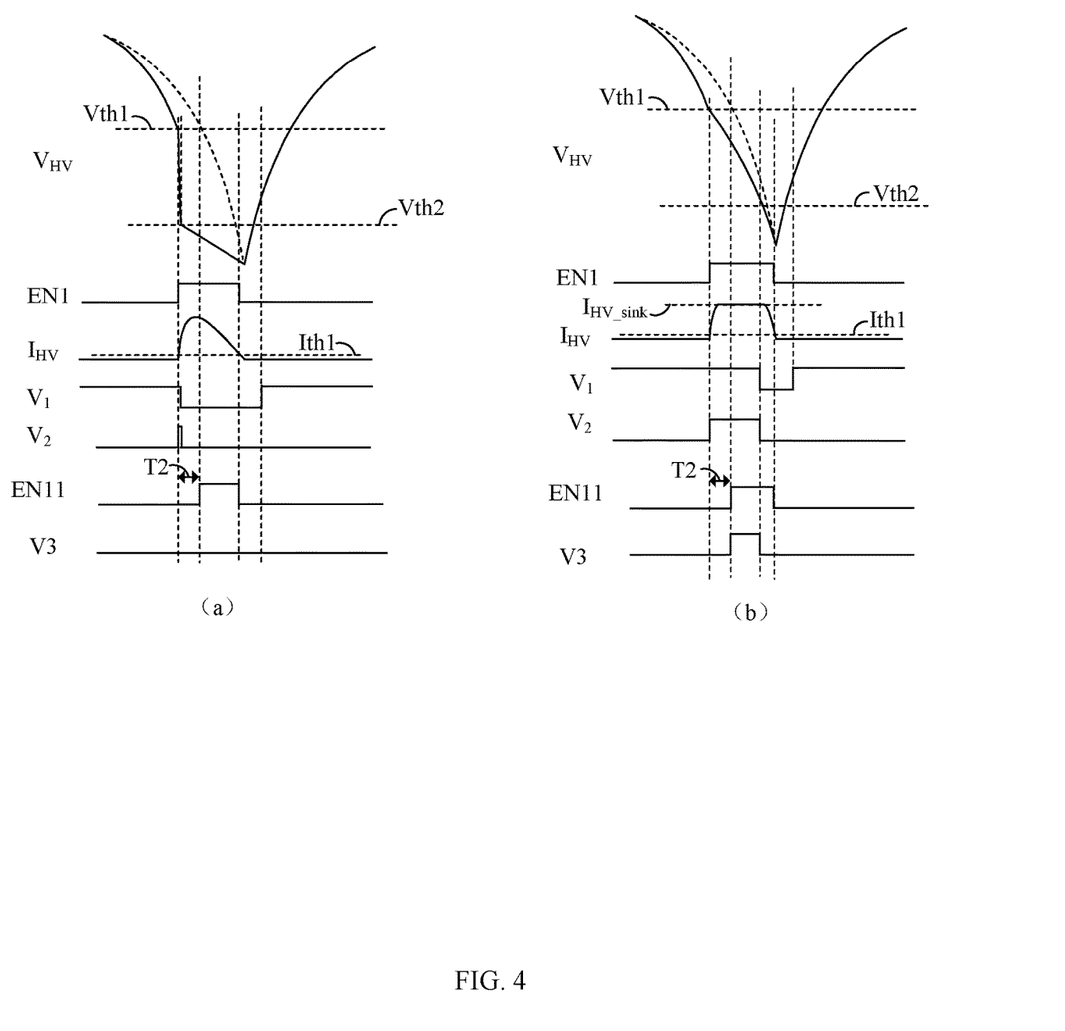
FIG. 4 is a waveform diagram of a first example operation of the leakage protection circuit, in accordance with embodiments of the predetermined invention.
Figure 5:
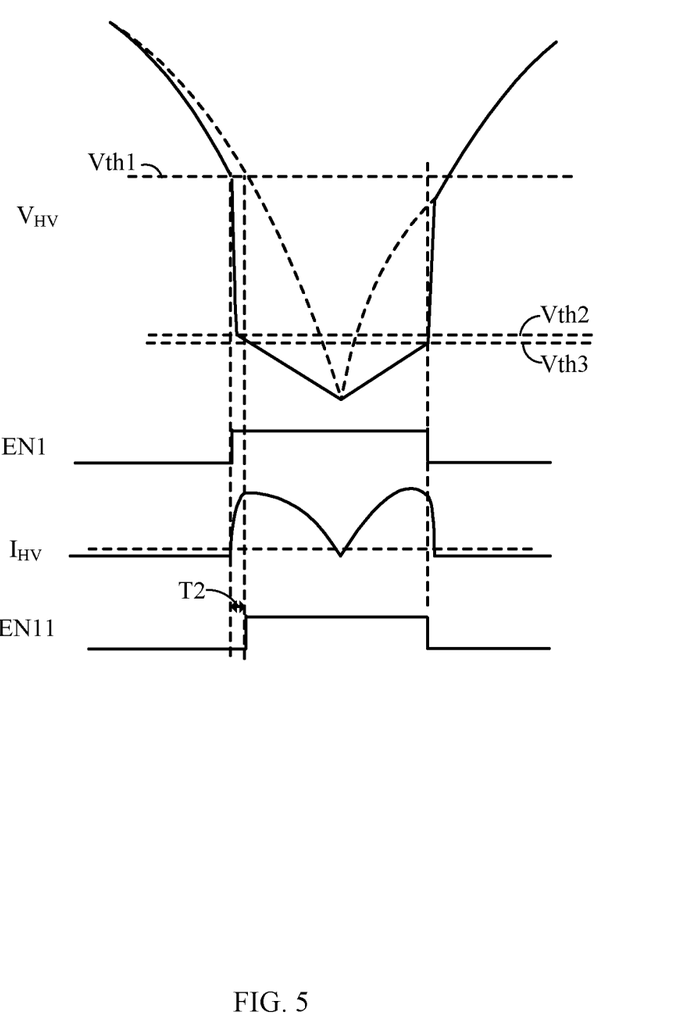
FIG. 5 is a waveform diagram of a second example operation of the leakage protection circuit, in accordance with embodiments of the predetermined invention.
Figure 6:
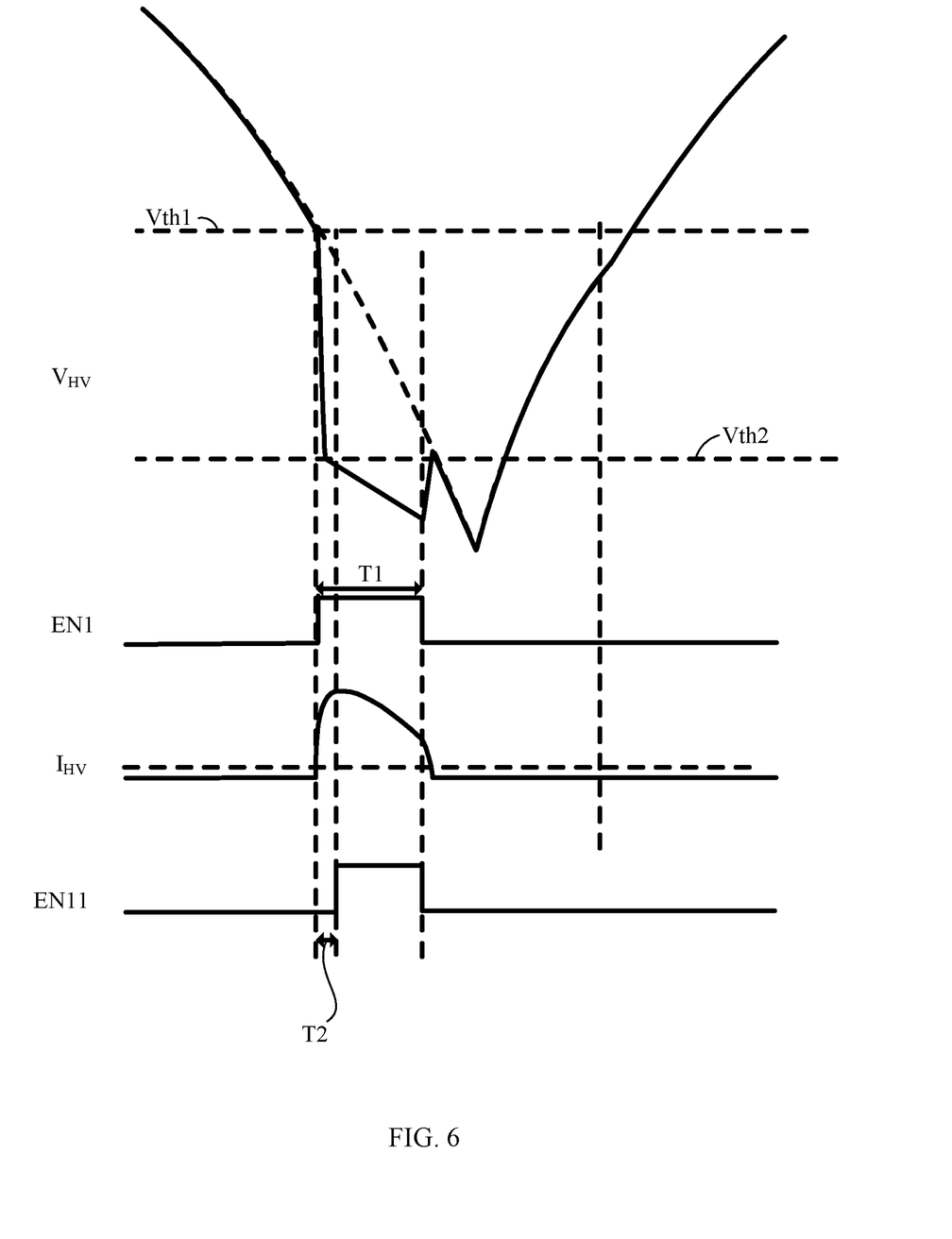
FIG. 6 is a waveform diagram of a third example operation of the leakage protection circuit, in accordance with embodiments of the predetermined invention.

According to the difference for the end moment of the predetermined time interval in the embodiment of the leakage protection circuit of FIG. 3, three corresponding operating waveforms are shown in FIGS. 4, 5, and 6, respectively. It should be noted that the three operating waveform diagrams differ in the end moment of the predetermined time interval, while other principles and operating processes are substantially the same, and the three operating waveform diagrams can be referred to and compared against each other.

Referring now to FIG. 4, shown is a waveform diagram of a first example operation of the leakage protection circuit, in accordance with embodiments of the predetermined invention. In this particular example, the end moment of the active interval of enable signal EN1 can be the end moment of the predetermined time interval. The end moment of the predetermined time interval can be the time when pull-down current $I_{HV}$ falls to a first current threshold, and enable signal EN1 can be switched to be inactive at the end moment of the predetermined time interval. FIG. 4 can include two waveforms (a) and (b), where the waveforms shown in 4(a) are operation waveforms when leakage occurs, and the waveforms shown in 4(b) are operation waveforms when no leakage occurs. Here, Vth1 can be the "first" voltage threshold, Vth2 can be configured as the "second" voltage threshold, T2 can be configured as the "second" time period, Ith1 can be configured as the "first" current threshold, and $I_{HV\_sink}$ can be configured as the saturation current of transconductance operational amplifier gsink. The saturation current can be equal to the transconductance of transconductance operational amplifier gsink multiplied by the difference at the input terminals thereof. Although the above describes that the active interval of enable signal EN1 being at a high level, those skilled in the art will recognize that the active interval of enable signal EN1 may alternatively be at a low level.

The waveforms of voltage detection signal $V_{HV}$, enable signal EN1, pull-down current $I_HV_{HV}$, signal $V_1$, signal $V_2$, signal EN11 representative of the detection time interval, and signal $V_3$ varying with time are shown from top to bottom. For example, signal $V_1$ can be generated by comparing voltage detection signal $V_{HV}$ against the second voltage threshold, signal $V_2$ can be generated by signal $V_1$ being logically AND'ed with enable signal EN1, and signal $V_3$ can be generated by signal $V_1$ being logically AND'ed with EN11.

When voltage detection signal $V_{HV}$ decreases to voltage threshold Vth1, transconductance operational amplifier gsink can generate pull-down current $I_{HV}$. When pull-down current $I_{HV}$ is less than current threshold Ith1, pull-down current $I_{HV}$ can be cut off. The predetermined time interval can be configured as the active interval of enable signal EN1 (e.g., at a high level), the start moment of the predetermined time interval can be a moment when voltage detection signal $V_{HV}$ decreases to voltage threshold Vth1, and the end moment of the predetermined time interval can be a moment when pull-down current $I_{HV}$ is less than current threshold Ith1.

When voltage detection signal $V_{HV}$ is greater than voltage threshold Vth2, signal $V_1$ can be at a high level. When voltage detection signal $V_{HV}$ is less than voltage threshold Vth2, signal V1 can be at a low level. During the predetermined time interval, whether leakage occurs can be determined according to the change state of voltage detection signal $V_{HV}$ that is representative of the output voltage of rectifier circuit 1. In the active interval of enable signal EN1, when voltage detection signal $V_{HV}$ is higher than voltage threshold Vth2, signal $V_2$ can be at a high level. When voltage detection signal $V_{HV}$ is not greater than voltage threshold Vth2, signal $V_2$ can be at a low level. In this way, whether leakage occurs can be determined according to signal $V_2$. If signal $V_2$ has a high level during the detection time interval, this may indicate that no leakage occurs, as shown in 4(a). If signal $V_2$ does not have a high level during the detection time interval, this may indicate that leakage occurs, as shown in 4(b). Here, the start moment of the detection time interval may be the start moment of the predetermined time interval.

Since it takes time for voltage detection signal $V_{HV}$ to decrease to voltage threshold Vth2, even if no leakage occurs, signal $V_2$ may also be high when enable signal EN1 is switched to be active, as shown in 4(a), and this may cause misjudgment. Therefore, the start moment of the detection time interval may be a moment that delays the start moment of the predetermined time interval by time period T2 in practice, and the active interval of signal EN11 can represent the detection time interval. The end moment of the detection time interval may be the same as the end moment of the predetermined time interval, and the start moment of the active interval of signal EN11 can be later than the start moment of the active interval of enable signal EN1 by time period T2. In this way, whether leakage occurs can be also determined according to signal $V_3$. If signal $V_3$ has a high level during the detection time interval, this may indicate that no leakage occurs, as shown in 4(b). If signal $V_3$ does not have a high level during the detection time interval, this may indicate that leakage occurs, as shown in 4(a).

Referring now to FIG. 5, shown is a waveform diagram of a second example operation of the leakage protection circuit, in accordance with embodiments of the predetermined invention. The end moment of the active interval of enable signal EN1 can be configured as the end moment of the predetermined time interval, and the end moment of the predetermined time interval may be the moment when the voltage detection signal reaches voltage threshold Vth3 for the second time. When voltage detection signal $V_{HV}$ reaches voltage threshold Vth3 for the second time, enable signal EN1 can be switched from an active state to an inactive state, and pull-down current generation circuit 2 can stop generating pull-down current $I_{HV}$. For example, voltage threshold Vth3 is less than voltage threshold Vth2.

When voltage detection signal $V_{HV}$ is less than voltage threshold Vth1, transconductance operational amplifier gsink can generate pull-down current $I_{HV}$. When voltage detection signal $V_{HV}$ reaches voltage threshold Vth3 for the second time, pull-down current $I_{HV}$ may be cut off. The predetermined time interval can be configured as the active interval of enable signal EN1 (e.g., at a high level). The start moment of the predetermined time interval can be a moment when voltage detection signal $V_{HV}$ decreases to voltage threshold Vth1. Also, the end moment of the predetermined time interval can be configured as a moment when voltage detection signal $V_{HV}$ reaches voltage threshold Vth3 for the second time.

Referring now to FIG. 6, shown is a waveform diagram of a third example operation of the leakage protection circuit, in accordance with embodiments of the predetermined invention. The end moment of the active interval of enable signal EN1 can be the end moment of the predetermined time interval, and the end moment of the predetermined time interval may be a moment when the start moment of the predetermined time interval is delayed by time period T1. When pull-down current generation circuit 2 is enabled for time period T1, enable signal EN1 can be switched from an active state to an inactive state, and pull-down current generation circuit 2 can stop generating pull-down current $I_{HV}$.

When voltage detection signal $V_{HV}$ is less than voltage threshold Vth1, transconductance operational amplifier gsink can generate pull-down current $I_{HV}$, and pull-down current $I_{HV}$ may be cut off after time period T1. The predetermined time interval can be configured as the active interval of enable signal EN1 (e.g., at a high level), the start moment of the predetermined time interval can be the time when voltage detection signal $V_{HV}$ decreases to voltage threshold Vth1, and the end moment of the predetermined time interval can be a moment when the start moment of the predetermined time interval is delayed by time period T1.

Figure 7:
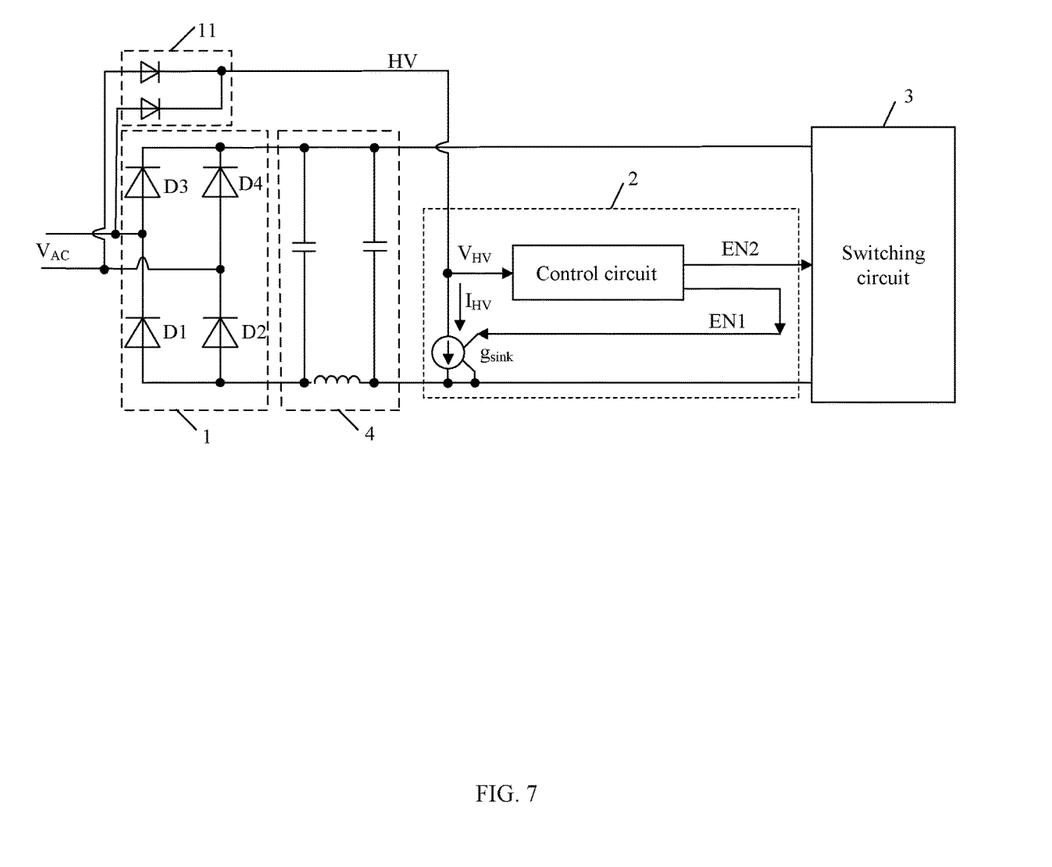
FIG. 7 is a schematic block diagram of a second example load driving circuit, in accordance with embodiments of the predetermined invention.

Referring now to FIG. 7, shown is a schematic block diagram of an example load driving circuit, in accordance with embodiments of the predetermined invention. This load driving circuit can include rectifier circuit 1, switching circuit 3, leakage protection circuit 2, and filter circuit 4. Filter circuit 4 can connect before or after leakage protection circuit 2, and may filter the output voltage of rectifier circuit 1. In this embodiment, filter circuit 4 can connect between rectifier circuit 1 and leakage protection circuit 2, such that leakage protection circuit 2 can perform leakage protection after filtering. Since the voltage detection signal can be acquired at the high potential of the output terminal of rectifier circuit 1, another rectifier circuit 11 may be included in the load driving circuit. In this particular example, rectifier circuit 11 for leakage protection circuit 2 may partially multiplex rectifier circuit 1 of the main circuit. That is, rectifier circuit 11 for the leakage protection circuit may multiplex two diodes (e.g., diodes D1 and D2) of rectifier circuit 1 in the main circuit, in order to perform rectification. In other examples, a single rectifier circuit can also be applied to generate the voltage detection signal, and the pull-down current can be generated in accordance with the voltage detection signal. In another example, filter circuit 4 can connect between leakage protection circuit 2 and switching circuit 3, such that leakage protection circuit 2 can perform leakage protection before filtering, and only one rectifier circuit 11 may be needed in the load driving circuit.

Figure 8:
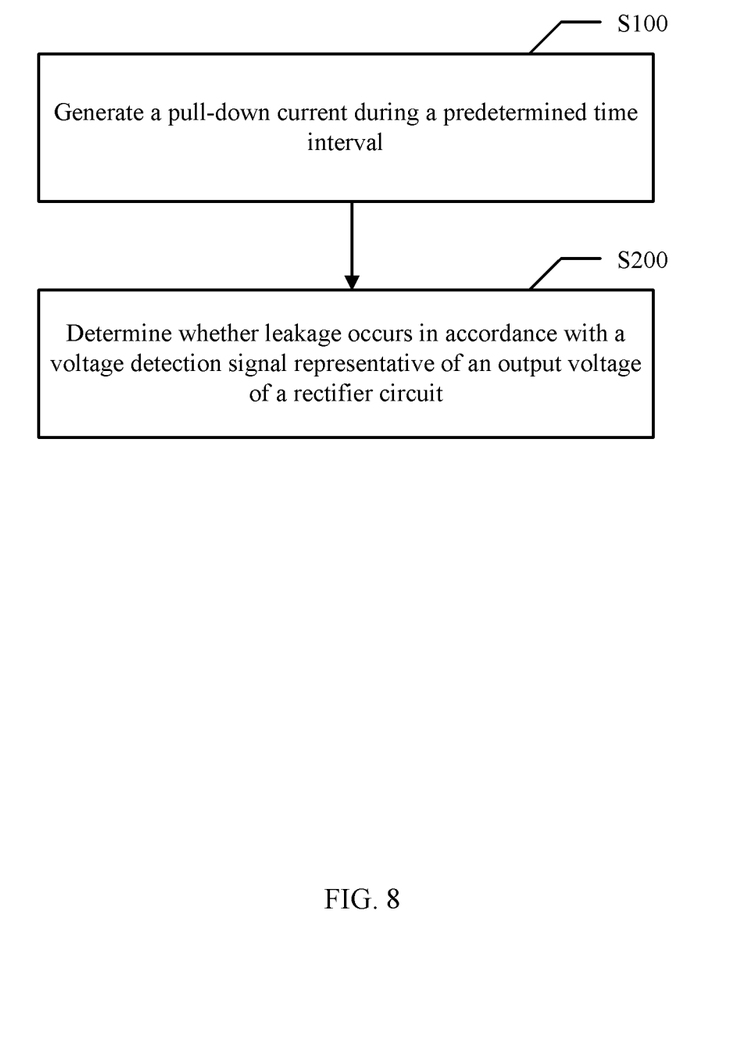
FIG. 8 is a flow diagram of an example leakage protection method, in accordance with embodiments of the predetermined invention.

Referring now to FIG. 8, shown is a flow diagram of an example leakage protection method, in accordance with embodiments of the predetermined invention. At S100, a pull-down current can be generated during a predetermined time interval. At S200, whether leakage occurs can be determined in accordance with a voltage detection signal that is representative of an output voltage of a rectifier circuit.

For example, a start moment of the predetermined time interval can be a moment when the voltage detection signal decreases to a first voltage threshold. The change rate of the voltage detection signal over time when leakage occurs may be greater than the change rate of the voltage detection signal over time when leakage does not occur. Further, if leakage occurs, no energy may be transferred to the load coupled to the output terminals of the rectifier circuit. If leakage does not occur, energy can be allowed to be transferred to the load coupled to the output terminals of rectifier circuit 1, and whether leakage occurs can be determined in a next cycle. In one embodiment, when leakage protection circuit 2 detects no leakage for N times, energy can be allowed to be transferred to the load coupled to the output terminals of rectifier circuit 1. Otherwise, no energy may be transferred to the load coupled to the output terminals of rectifier circuit 1. For example, N is an integer that is greater than or equal to 1. Leakage protection circuit 2 can determine whether leakage occurs by performing multiple detections, and if no leakage occurs after multiple detections, energy can be allowed to be transferred to the load coupled to the output terminals of rectifier circuit 1.

In one embodiment, the change rate of the voltage detection signal over time can be determined by comparing the voltage detection signal against a second voltage threshold in the detection time interval. When the voltage detection signal is always less than the second voltage threshold during the detection time interval, it may be determined that leakage occurs. When the voltage detection signal is not less than the second voltage threshold during the detection time interval, it may be determined that no leakage occurs. For example, the detection time interval may be within the predetermined time interval, and the second voltage threshold can be less than the first voltage threshold.

For example, an end moment of the predetermined time interval may be the same as an end moment of the predetermined time interval, and the start moment of the detection time interval may not be earlier than a start moment of the predetermined time interval. For example, a start moment of the predetermined time interval can be a moment when the voltage detection signal decreases to the first voltage threshold. An end moment of the predetermined time interval may be optional in different applications. For example, the end moment of the predetermined time interval may be a moment when the pull-down current decreases to the first current threshold. In another embodiment, the end moment of the predetermined time interval may be a moment when the voltage detection signal reaches a third voltage threshold for the second time, and the third voltage threshold can be less than the second voltage threshold. In another embodiment, the end moment of the predetermined time interval may be a moment when the start moment of the predetermined time interval is delayed by a first time period.

The embodiments were chosen and described in order to best explain the principles of the invention and its practical applications, to thereby enable others skilled in the art to best utilize the invention and various embodiments with modifications as are suited to particular use(s) contemplated. It is intended that the scope of the invention be defined by the claims appended hereto and their equivalents.

What is claimed is:

1. A leakage protection circuit, comprising:
   a) a pull-down current generation circuit coupled between output terminals of a rectifier circuit; and
   b) a control circuit configured to control the pull-down current generation circuit to generate a pull-down current during a predetermined time interval, and to determine whether leakage occurs in accordance with a voltage detection signal that is representative of an output voltage of the rectifier circuit.

2. The leakage protection circuit of claim 1, wherein a change rate of the voltage detection signal when leakage occurs is greater than the change rate of the voltage detection signal when leakage does not occur.

3. The leakage protection circuit of claim 1, wherein no energy is transferred to a load coupled to the output terminals of the rectifier circuit when leakage occurs.

4. The leakage protection circuit of claim 1, wherein energy is allowed to be transferred to a load coupled to the output terminals of the rectifier circuit when no leakage occurs.

5. The leakage protection circuit of claim 1, wherein:
   a) when the leakage is detected as not occurring continuously for N times, energy is allowed to be transferred to a load that is coupled to the output terminals of the rectifier circuit; and
   b) N is an integer that is greater than or equal to 1.

6. The leakage protection circuit of claim 1, wherein the predetermined time interval is configured to be a time interval where the voltage detection signal is less than a first voltage threshold.

7. The leakage protection circuit of claim 6, wherein:
   a) when the voltage detection signal is consistently less than a second voltage threshold during a detection time interval, it is determined that leakage occurs;
   b) when the voltage detection signal is not less than the second voltage threshold during the detection time interval, it is determined that no leakage occurs;

c) the detection time interval is included in the predetermined time interval; and d) the second voltage threshold is less than the first voltage threshold.

8. The leakage protection circuit of claim 7, wherein:

a) an end moment of the detection time interval is consistent with an end moment of the predetermined time interval; and b) a start moment of the detection time interval is later than a start moment of the predetermined time interval.

9. The leakage protection circuit of claim 1, wherein a start moment of the predetermined time interval is configured to be a moment when the voltage detection signal decreases to a first voltage threshold.

10. The leakage protection circuit of claim 9, wherein the end moment of the predetermined time interval is configured as a moment when the pull-down current decreases to a first current threshold.

11. The leakage protection circuit of claim 9, wherein:

a) the end moment of the predetermined time interval is configured as a moment when the voltage detection signal reaches a third voltage threshold for the second time; and b) the third voltage threshold is less than the second voltage threshold.

12. The leakage protection circuit of claim 9, wherein the end moment of the predetermined time interval is configured as a moment when the start moment of the predetermined time interval is delayed by a first time period.

13. The leakage protection circuit of claim 1, wherein:

a) the pull-down current generation circuit comprises a transconductance operational amplifier having an input terminal for receiving a first enable signal, and first and second output terminals coupling between the output terminals of a rectifier circuit; and b) an active interval of the first enable signal is configured as the predetermined time interval.

14. The leakage protection circuit of claim 1, wherein:

a) the pull-down current generation circuit comprises a transistor having a control terminal for receiving a first enable signal, and first and second power terminals coupling between the output terminals of the rectifier circuit; and b) an active interval of the first enable signal is configured as the predetermined time interval.

15. The leakage protection circuit of claim 14, wherein the transistor is configured as one of a MOSFET, a J-FET transistor, and a triode.

16. A method of performing leakage protection for input terminals of a load driving circuit, the method comprising:

a) generating a pull-down current during a predetermined time interval; and b) determining whether leakage occurs in accordance with a voltage detection signal that is representative of an output voltage of a rectifier circuit.

17. The method of claim 16, wherein the change rate of the voltage detection signal when leakage occurs is greater than a change rate of the voltage detection signal when leakage does not occur.

18. The method of claim 16, wherein no energy is transferred to a load coupled to the output terminals of the rectifier circuit when leakage occurs.

19. The method of claim 16, further comprising allowing energy to be transferred to a load coupled to the output terminals of the rectifier circuit when no leakage occurs.

20. The method of claim 16, further comprising allowing energy to be transferred to a load coupled to the output terminals of the rectifier circuit when the leakage is detected as not occurring continuously for N times, wherein N is an integer that is greater than or equal to 1.

* * * * *